United States Patent [19]
Borkar et al.

[11] Patent Number: 6,137,688
[45] Date of Patent: *Oct. 24, 2000

[54] APPARATUS FOR RETROFIT MOUNTING A VLSI CHIP TO A COMPUTER CHASSIS FOR CURRENT SUPPLY

[75] Inventors: Shekhar Yeshwant Borkar, Portland, Oreg.; Robert S. Dreyer, Palo Alto; Hans J. Mulder, San Francisco, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/775,784

[22] Filed: Dec. 31, 1996

[51] Int. Cl.⁷ .............................. H05K 5/02; H05K 5/04; H05K 7/14; H05K 9/00
[52] U.S. Cl. ..................... 361/753; 361/683; 361/686; 361/697; 361/714; 361/717; 361/718; 361/767; 361/799; 361/800; 361/807; 361/808; 361/809; 361/816; 361/820; 257/691; 257/697; 257/726; 257/727; 174/35 R; 174/51; 174/52.1
[58] Field of Search ............................ 174/51, 255, 260, 174/261; 257/691, 697, 700, 723, 724, 737, 738, 778, 780, 786; 361/760, 761, 764, 767, 772, 773, 774, 775, 780, 783, 792–795, 600, 679, 683, 686, 728, 752, 753, 796, 797, 799, 800, 816, 818, 820; 439/68, 83, 70, 71, 69

[56] References Cited

U.S. PATENT DOCUMENTS

| | | |
|---|---|---|
| 3,761,883 | 9/1973 | Alvarez et al. . |
| 4,185,245 | 1/1980 | Fellinger et al. . |
| 4,288,839 | 9/1981 | Prager et al. ............................ 257/726 |
| 4,398,325 | 8/1983 | Piaget et al. ............................ 29/25.35 |
| 4,423,482 | 12/1983 | Hargrove et al. . |
| 4,502,098 | 2/1985 | Brown et al. . |
| 4,628,411 | 12/1986 | Balderes et al. . |
| 4,638,311 | 1/1987 | Gerety . |
| 4,644,348 | 2/1987 | Gerety . |
| 4,685,034 | 8/1987 | Tetsu et al. .............................. 361/818 |
| 4,692,894 | 9/1987 | Bemis . |
| 4,771,391 | 9/1988 | Blasbalg . |
| 4,825,337 | 4/1989 | Karpman . |
| 4,860,309 | 8/1989 | Costello . |
| 4,901,277 | 2/1990 | Soloway et al. . |
| 4,939,389 | 7/1990 | Cox et al. . |
| 4,975,605 | 12/1990 | Bazes . |
| 4,982,311 | 1/1991 | Dehaine et al. ......................... 361/708 |
| 4,992,925 | 2/1991 | Meyer . |
| 5,045,971 | 9/1991 | Ono et al. . |
| 5,101,480 | 3/1992 | Shin et al. . |

(List continued on next page.)

FOREIGN PATENT DOCUMENTS

| | | |
|---|---|---|
| 1-41255 | 2/1989 | Japan ..................................... 257/700 |
| 64-41255 | 2/1989 | Japan . |
| 412115 | 11/1966 | Switzerland . |

*Primary Examiner*—Jeffrey Gaffin
*Assistant Examiner*—John B. Vigushin
*Attorney, Agent, or Firm*—Blakely, Sokoloff, Taylor & Zafman LLP

[57] ABSTRACT

A method and apparatus are provided for mounting a Very Large Scale Integration (VLSI) chip such as a microprocessor on the back plane of a computer chassis. In one embodiment, the mounting on the computer chassis is configured to provide a current supply connection for delivering a high level of current to the microprocessor from a current source through the computer chassis. Also provided are a method and apparatus for mounting a VLSI chip such as a microprocessor on the chassis of a computer system in order to dissipate heat from the VLSI chip to the ambient outside the computer system through the computer chassis. Also provided are a method and apparatus for signal interconnections among one or several VLSI chips such as microprocessors mounted on the chassis of a computer to provide signal capacity with strong integrity. Also provided are a method and apparatus for mounting a power supply for a VLSI chip package on the back chassis of a computer.

12 Claims, 17 Drawing Sheets

6,137,688
Page 2

U.S. PATENT DOCUMENTS

| | | | |
|---|---|---|---|
| 5,117,330 | 5/1992 | Miazga . | |
| 5,136,471 | 8/1992 | Inasaka | 361/784 |
| 5,138,523 | 8/1992 | Benck et al. . | |
| 5,218,677 | 6/1993 | Bono et al. . | |
| 5,220,211 | 6/1993 | Christopher et al. . | |
| 5,223,741 | 6/1993 | Bechtel et al. | 257/678 |
| 5,272,593 | 12/1993 | Jakob et al. . | |
| 5,280,584 | 1/1994 | Caesar et al. . | |
| 5,289,364 | 2/1994 | Sakurai . | |
| 5,327,324 | 7/1994 | Roth . | |
| 5,339,214 | 8/1994 | Nelson . | |
| 5,347,559 | 9/1994 | Hawkins et al. . | |
| 5,357,616 | 10/1994 | Ban . | |
| 5,359,495 | 10/1994 | Margalit et al. . | |
| 5,363,484 | 11/1994 | Desnoyers et al. . | |
| 5,377,325 | 12/1994 | Chan . | |
| 5,383,340 | 1/1995 | Larson et al. | 361/700 |
| 5,390,734 | 2/1995 | Voorhes et al. . | |
| 5,398,325 | 3/1995 | Chang et al. . | |
| 5,411,077 | 5/1995 | Tousignant . | |
| 5,426,563 | 6/1995 | Moresco et al. . | |
| 5,440,450 | 8/1995 | Lau et al. . | |
| 5,450,548 | 9/1995 | Matsushima . | |
| 5,461,540 | 10/1995 | Lee . | |
| 5,483,102 | 1/1996 | Neal et al. . | |
| 5,491,812 | 2/1996 | Pisello et al. . | |
| 5,497,289 | 3/1996 | Sugishima et al. . | |
| 5,504,605 | 4/1996 | Sakuma et al. | 349/58 |
| 5,544,017 | 8/1996 | Beilin et al. . | |
| 5,546,023 | 8/1996 | Borkar et al. . | |
| 5,548,484 | 8/1996 | Kantner . | |
| 5,570,270 | 10/1996 | Naedel et al. . | |
| 5,579,212 | 11/1996 | Albano et al. | 257/726 |
| 5,606,341 | 2/1997 | Aguilera | 361/699 |
| 5,621,613 | 4/1997 | Haley et al. | 361/687 |
| 5,623,644 | 4/1997 | Self et al. . | |
| 5,625,535 | 4/1997 | Hulsebosch et al. . | |
| 5,626,480 | 5/1997 | Baumbaugh . | |
| 5,627,413 | 5/1997 | Mughir et al. . | |
| 5,628,363 | 5/1997 | Dewar et al. | 165/164 |
| 5,628,508 | 5/1997 | Hiraki | 361/818 |
| 5,634,043 | 5/1997 | Self et al. . | |
| 5,634,351 | 6/1997 | Larson et al. | 361/700 |
| 5,660,321 | 8/1997 | Mashimoto et al. . | |
| 5,666,261 | 9/1997 | Aguilera | 361/681 |
| 5,673,176 | 9/1997 | Penniman et al. . | |
| 5,676,199 | 10/1997 | Lee . | |
| 5,706,171 | 1/1998 | Edwards et al. . | |
| 5,712,762 | 1/1998 | Webb . | |
| 5,714,789 | 2/1998 | Estes et al. | 257/414 |
| 5,774,333 | 6/1998 | Janik et al. | 361/687 |

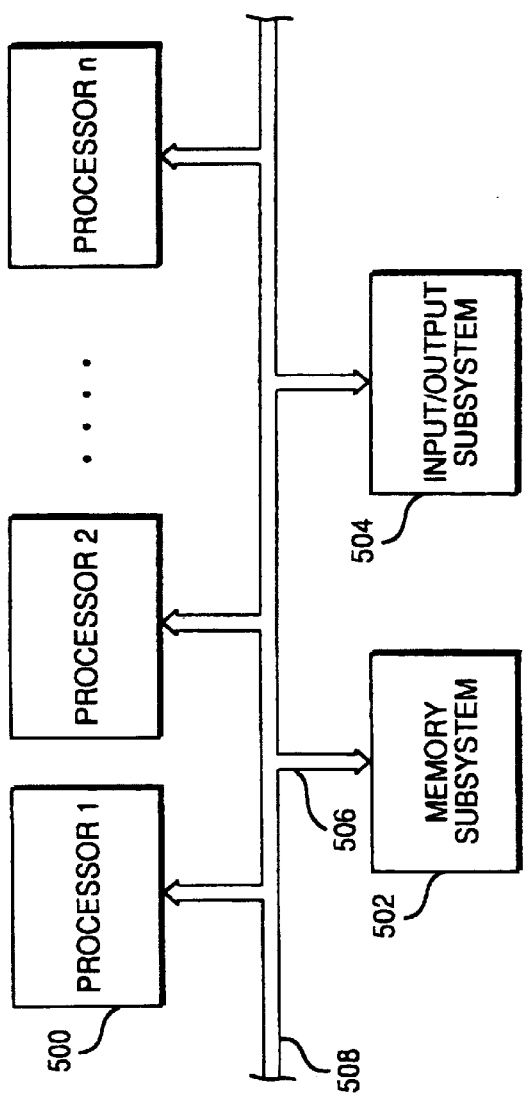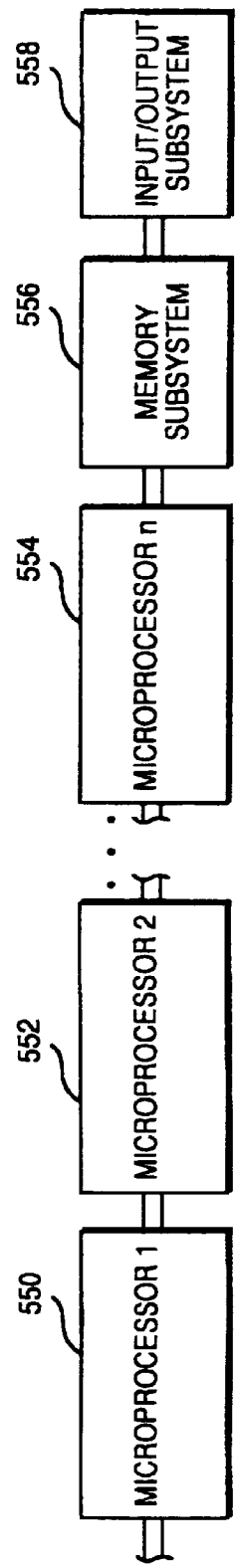
Figure 5A
Prior Art
Figure 5B
Prior Art

APPARATUS FOR RETROFIT MOUNTING A VLSI CHIP TO A COMPUTER CHASSIS FOR CURRENT SUPPLY

RELATED APPLICATIONS

The present application is related to the following patent and co-pending applications: U.S. Patent entitled "Daisy Chained Clock Distribution Scheme," by Borkar, et al., Pat. No. 5,546,023, issued Aug. 13, 1996 and filed Jun. 26, 1995; U.S. Pat. application entitled "Point-To-Point Phase-Tolerant Communication," by Self et al., application Ser. No. 08/296,019, filed Aug. 25, 1994; U.S. Pat. application entitled "Microprocessor Point-To-Point Communication," by Self et al., application Ser. No. 08/295,556, filed Aug. 25, 1994; U.S. Pat. application entitled Method For Controlling Solder Bump Height and Volume for Substrates Containing both Pad-On and Pad-Off via Contacts, by Mashimoto, application Ser. No. 08/625,797, filed Mar. 29, 1996; U.S. application entitled "Power-Pod Power Delivery System," by McCutchan et al., application Ser. No. 08/672,864, filed on Jun. 28, 1996; U.S. Pat. application entitled "Use of Flexible Interconnects and Point-to-Point Communications Protocol to Connect Subsystems with Dissimilar Thermal Properties," by Borkar et al., application Ser. No. 08/777260, filed Dec. 31, 1996; U.S. Pat. application entitled "Method and Apparatus for Mounting a Very Large Scale Integration (VLSI) Chip Package to a Computer Chassis for Cooling," by Borkar et al., application Ser. No. 08/777601, filed Dec. 31, 1996; U.S. Pat. application entitled "Method and Apparatus for Retrofit Mounting a VLSI Chip to a Computer Chassis for Cooling," by Borkar et al., application Ser. No. 08/777251, filed Dec. 31, 1996; U.S. Pat. application entitled "Method and Apparatus for Mounting a Very Large Scale Integration (VLSI) Chip Package to a Computer Chassis for Current Supply," by Borkar et al., application Ser. No. 08/777604, filed Dec. 31, 1996; and U.S. Pat. application entitled "Method and Apparatus for Mounting a Power Supply to a Computer Chassis for Cooling," by Borkar et al., application Ser. No. 08/775,782, filed Dec. 31, 1996

FIELD OF THE INVENTION

The present invention generally relates to the arrangement of components in a computer system and, more particularly, relates to the mounting of a Very Large Scale Integration (VLSI) chip on the chassis of a personal computer.

BACKGROUND OF THE INVENTION

A Very Large Scale Integration (VLSI) chip is generally composed of a silicon die having an integrated circuit printed thereon, a package for housing the silicon die that can be made of ceramic, organic or other types of chip carrier packages, and various means of electronic connection to the silicon die that extends to the exterior of the package for connection in an electronic system. Transistors and other circuit components reside on the silicon die in printed form and require power and signal connection extending to the exterior of the package. These connections would typically be coupled to a printed circuit board for further integration with other electronic components. The component features of the silicon die are extremely small, in the order of 0.1 to 1 micro-meter (Micron), whereas the features in the printed circuit board are in the order of 0.1 to 1 millimeter (mm). The connection configurations of a chip package bridge this large scaling gap by providing power and signal connections between the silicon die and the printed circuit board.

Referring to FIG. 1A, one configuration of a conventional chip package 100 is shown. The VLSI 102 is shown mounted on a ceramic base 104 and is connected via bond wires 106 to connection pins 108 through pin circuitry 112 of the chip package 100. The ceramic base 104 is coupled to the chip package 100 to dissipate heat from the VLSI 102 into the ambient outside the chip package 100. Also, the bond wires 106 are often a tenuous connection in the package 100 and are subject to defects. The connection pins 108 are configured to mount on a circuit board for further connection to other components.

Referring now to FIG. 1B, a top view of the chip package 100 is shown where bond wires 106 connect bonding pads 110 to the pin circuitry 112. As a result of manufacturing constraints, a design utilizing bond wires 106 such as in the chip package 100 have a limited access to pads 110 such that the pads 110 reside only on the periphery of the VLSI 102. Thus, the number of power and signal connections are greatly limited by the number of pads that can be accessed around the periphery of VLSI chip 102.

A second configuration of a conventional chip package 114 is shown in FIG. 1C. This configuration is known in the art as a "C-4 mount." In this configuration, the VLSI chip 116 is connected to the pin circuitry 118 via soldering bumps 120 located on the bottom surface of the VLSI chip 116. Here, the chip is inverted, or flipped, so that connections can be made to pins 108. As can be seen in FIG. 1D, this configuration allows a greater number of landing pads 122 on the surface of the VLSI chip 116 since the design is not limited to placing the landing pads on the periphery of the surface of VLSI 116. This solves the need for the increasing number of connections required to VLSI chips, particularly, microprocessors that have ever increasing demands for more signals and more power. An increase in the number of connections to the landing pads 122 allows for more signal lines and power lines to the VLSI chip. Also, the bond wires used in the design of FIG. 1 are eliminated. Details regarding one method of solder connections used in joining integrated semiconductor devices are found in related application "Multilayer Solder Interconnection Structure" of Mashimoto et al. cited above. Demands for higher power and more signals, however, continue to increase.

Every generation of VLSI chips continue to grow in complexity, performance and power consumption. As a result, the current demands for the chips also increase. One of the biggest challenges for future generations of chips is managing the chip's power consumption. Presently, the power consumption of a typical microprocessor is between 1 and 60 watts. As new generations of microprocessors are developed, however, the power demands are expected to increase into the hundreds or even thousands of watts as complexity of the chip increases and as better chip performance is demanded. Also, as more complicated microprocessors are developed, more transistors are used, the size of the silicon die grows and the signal frequency greatly increases. The net effect is that the power and current demands will continue to be major concerns in chip design.

One modern solution to manage increased power demand is voltage scaling. Voltage scaling is the process of reducing the voltage level of signals located inside and outside the VLSI chips so that less power is demanded. Power has a quadratic relationship to voltage where power is proportional to the square of the voltage. Hence, if the supply voltage is reduced by half, the power is reduced by one-fourth, giving a dramatic decrease in the power demand. Voltage scaling continues to be practiced in modern chip designs. For example, in the 1980's, the typical power supply voltage was 5 volts. Later in the 1990's, the average supply voltage was reduced to 3.3 volts. More modern designs have reduced the supply voltage to as low as 2.5 volts and even 1.8 volts. Voltage scaling, however, has its limits and the continuing increase in power and current demands are still inevitable.

CURRENT DEMAND

Unlike power, current is linearly proportional to voltage. Therefore, if the supply voltage is reduced by half, the current is also reduced by half. Hence, voltage scaling only reduces supply currents by the same rate as reduction in voltage. Referring to FIG. 2, a logarithmic graph selected of microprocessor current demands over time is shown. For example, the Intel 386 microprocessor had a current demand of less than 0.2 amperes. In 1989, the INTEL 486 microprocessor had twice the demand of the 386 microprocessor of approximately 0.4 amperes. Still further, the Pentium processor, available in 1983, had a much higher power demand of around 3 amperes. At this rate, according to the projected graph of FIG. 2, as time goes on, the current demand for microprocessors will greatly increase into the hundreds and even thousands of amperes.

As mentioned above, the present designs of chip packages supply power and ground currents to the silicon die using package pins, bond wires, solder bumps and landing pads on the die. As current and signal demands increase, the number of package pins and VLSI landing pads will increase dramatically in order to meet the demand of the current supplies and signal connections. Conventional technology can allow for around 100 milliamperes for each landing pad on the die without sacrificing performance of the chip. As a result, as complexity, performance and power demands increase, a larger number of landing pads and pins will be required that consume a great amount of space on the silicon die. All of these factors increase the cost of producing the chip.

In conventional systems, supply current and ground current sources are connected to the chip packages in the same fashion as communication signals. The supply current and ground current connections supply the energy needed for the VLSI chip's operation. Unlike the signal connection, the supply current and ground current sources (Vcc, Vss, respectively ) have very few connections to the chip. The communication lines, however, carry a very low amount of current and are greater in number. As power demand increases, however, a larger number of supply and ground current connections will be needed in order to keep up with the higher demanding VLSI chips. A major problem is that for every supply and signal there exists one pin on the package, one bond wire or solder connection to the die and one landing pad on the die. As complexity increases, the chip package becomes crowded with electrical connections. One solution would be to reduce the number of pins in the package. Unfortunately, this would increase the resistance in the signal path, thereby increasing the voltage drop in accordance with Ohm's law (V=IR). The result is supplying reduced voltage to the chip. On the other hand, if the number of pins is increased, the result is a larger package for the silicon die, which ultimately increases the cost of the chip. Typically, these two design parameters are balanced in determining the proper number of power and ground paths for a given application. It would be useful to provide a supply current directly to the chip to eliminate the need for multiple pins to the chip using conventional electrical connections. As will be seen, one embodiment of the present invention solves this problem in a simple and elegant manner.

HEAT DISSIPATION

With ever increasing power demands in next generation microprocessors and other VLSI's, heat dissipation is becoming another design concern. FIG. 3 illustrates a conventional solution to power dissipation in a VLSI chip package 300. The overall package 300 is similar to that of FIG. 1 with the addition of cooling fins 302 mounted on base 304. The base 304 is typically made up of ceramic material for rapid heat dissipation and can also be constructed of organic or conductive material to help dissipate the heat through the cooling fins 302. The VLSI chip 306 generates heat which is dissipated through the solder connections 308 or other connections that transfer heat to the base 304 for ultimate dissipation through the cooling fins 302. The package is typically mounted to a mother board 310 via power and ground pins 312. The cooling fins 302 are usually exposed to the ambient within a system such a computer chassis that may further provide fans and other cooling means to help dissipate the heat generated by the components in the system. Other heat generating components in a computer system pose further problems in dissipating heat since, as a whole, the collective components increase the ambient temperature within the computer system. The demand for more compact systems such as laptop computers further complicates the heat dissipation problem by locating the heat generating components together closely in the system with often inadequate means to dissipate heat.

A modern method and more aggressive cooling technique is illustrated in FIG. 4 having cooling fans 400 located closely to the cooling fins 402 and mounted on the chip packages 404. Like the design of FIG. 3, the chip packages 404 are still mounted to the mother board 406 via power and ground pins 408 for interconnection to the rest of the system (not shown). The cooling fins can be mounted directly on the chip package and are capable of dissipating a large amount of heat from the VLSI chip packages 404. Power converters 410 are usually mounted in close proximity to the chip packages 404 for convenient access to the chip packages 404. Although effective, even this modern cooling method has its limits and will eventually become obsolete as power demands for VLSI chips increase.

It will be appreciated by those skilled in the art that the rate of cooling is directly proportional to the difference in temperature, Newton's law. Since the inside of a computer system, for example, is warm as a result of the collective heat generating components, it will be useful to somehow expose the VLSI chips to the ambient of lower temperature for more efficient heat dissipation.

One technique used in the entertainment electronics industry is to expose large heat generating transistors to the backside of, for example, an audio amplifier by mounting the transistors on the backside of the amplifier chassis. The chassis is exposed to the ambient outside the system and, therefore, is able to dissipate heat from the heat generating transistors to the outside ambient via the chassis. It would be useful to devise a similar scheme to computer systems to take advantage of the heat dissipation qualities of audio amplifiers. As will be seen, one embodiment of the present invention accomplishes this in a simple and elegant manner.

INTERCONNECTIONS

Conventional computer systems connect multiple processors through a bus network that provides communication among multiple processors, memory sub-systems, input/ output sub-systems and other sub-systems. FIG. 5A is a general block diagram of such a configuration where microprocessors 500 are connected to the memory sub-system 502 and input/output sub-system 504 via connection stubs 506 to system bus 508. In this configuration, the bus stubs 506 allow each agent on the bus, e.g. processors, memory sub-systems, and input/output sub-systems, . . . etc., to drive the bus with a signal which is broadcasted to all of the agents sharing the bus 508 through bus stubs 506. Each agent receives every broadcasted signal, but only the agent waiting for the appropriate signal interprets the signal. Performance of such a configuration is greatly limited since the bus is at risk of being overloaded when the agents connected to the bus 508 become demanding, greatly degrading the performance.

Referring now to FIG. 5B, an alternative configuration of computer components is illustrated. Microprocessors 550, 552, 554 are shown connected in series along with memory system 556 and input/output subsystem 558 connected in series. Such a configuration typically requires a point-to-point interconnection in order for the components to communicate and to transfer information throughout the system. Many advantages are realized by such a configuration. Most importantly, the hand-shaking or point-to-point interconnect provides a mechanism to produce consistent signals with low degradation. Protocols used in such configurations are well known. Examples of such protocols can be found in related U.S. Pat. No. 5,546,023 of Borkar et al. Referenced above are, "Point-To-Point Phase-Tolerant Communication" of Self et al. and "A Microprocessor Point-to-Point-Communication" of Self et al. cited above.

Removing the microprocessors and other VLSI chips away from their proximity to the other agents in such a configuration, for example, in order to move them to a different location, for cooling purposes, could greatly degrade their performance in the system. It would be useful, therefore, to devise a configuration that would allow the micro-processors and other VLSI chips to be moved out of the compact and warm environment and to allow exposure to other ambients providing better cooling for the VLSI chips. As will be seen in one embodiment, the present invention accomplishes this in a simple and elegant manner.

SUMMARY OF THE INVENTION

A method and apparatus are provided for mounting a Very Large Scale Integration (VLSI) chip such as a microprocessor on the back chassis of a computer. In one embodiment, the mounting on the computer chassis is configured to provide a current supply connection for delivering a high level of current to the microprocessor from a current source through the computer chassis. In another embodiment of the present invention, a method and apparatus are provided for mounting a VLSI chip such as a microprocessor on the chassis of a computer system in order to dissipate heat from the VLSI chip to the ambient outside the computer system through the computer chassis. In another embodiment of the present invention, a method and apparatus are provided for signal interconnections among one or several VLSI chips such as microprocessors mounted on the chassis of a computer to provide signal capacity with strong integrity. In yet another embodiment of the present invention, a method and apparatus are provided to mount a power supply for a VLSI chip package such as a microprocessor on the back chassis of a computer.

BRIEF DESCRIPTION OF THE DRAWINGS

FIG. 5A is a block representation of the prior art interconnections of components in a computer system;

FIG. 5B is a block representation of prior art interconnections of components in a computer system;

DETAILED DESCRIPTION

A method and apparatus are provided for mounting a Very Large Scale Integration (VLSI) chip package to a computer chassis such that a current supply is supplied to the VLSI chip package via the chassis. In this detailed description, one embodiment of a VLSI chip package is described showing interconnections to a computer system. It should be understood that this embodiment is for the purpose of illustration and is not provided as a limitation in that the present invention may be practiced on other VLSI chip packages where it is desirable to utilize mounting on a chassis of a computer system or other system.

Throughout this detailed description, numerous specific details are set forth regarding VLSI component interconnections, cooling devices, VLSI microprocessors, memory subsystems and various other subsystems to provide a thorough understanding of the present invention. It will be appreciated by one having ordinary skill in the art that the present invention may be practiced without such specific details. In other instances, well known components, structures and techniques have not been described in detail in order to avoid obscuring the subject matter of the present invention.

Figure 1A:
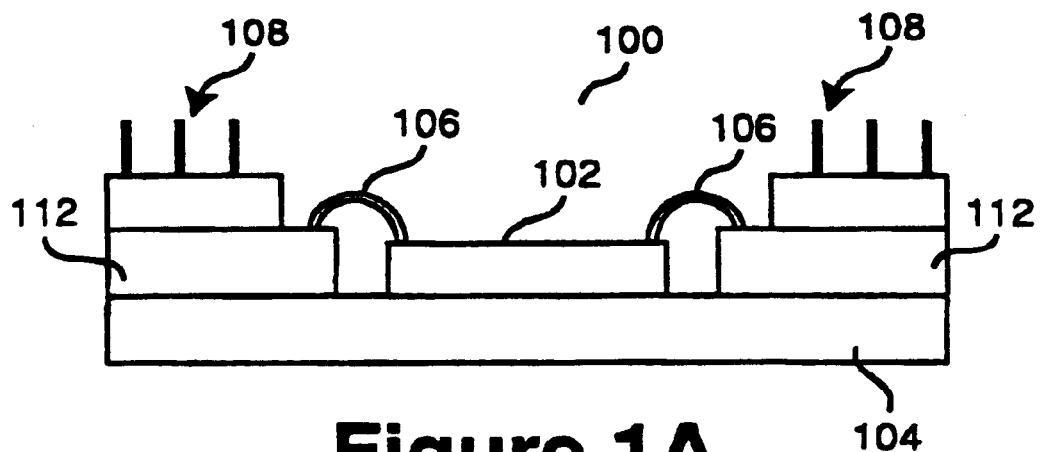
FIG. 1A is a general block diagram of a VLSI chip package of the prior art.
Figure 1B:
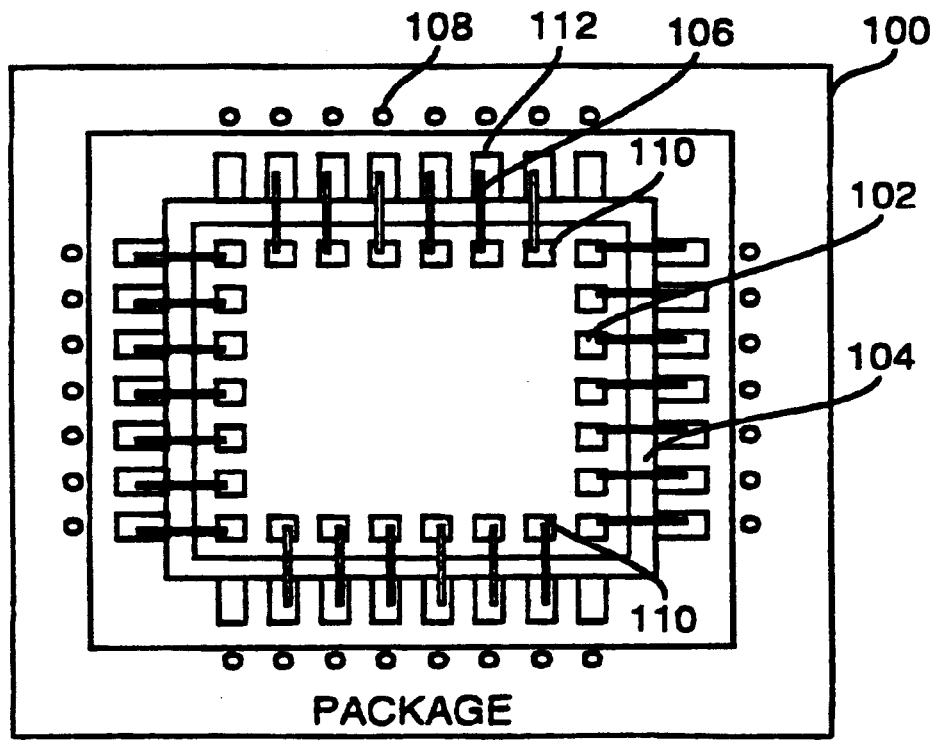
FIG. 1B is a top view of the VLSI chip package of FIG. 1 of the prior art.
Figure 1C:
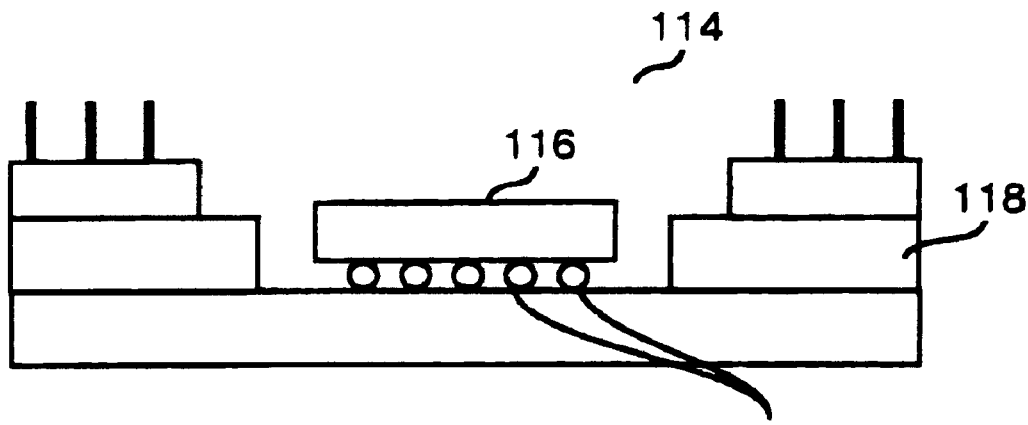
FIG. 1C is a general block diagram of another VLSI chip package configuration of the prior art.

Also, a VLSI chip package as described herein can include a microprocessor and micro-controller as well as many other types of circuits that are produced and sold in packages configured for integration into electrical circuits in which they interact. Presently, several types of chip packages exist for VLSI chips. One common package that is well known in the art is the "C-4 Mount" that is discussed above in relation to FIG. 1C. Another package for housing VLSI chips is the Micro BGA™ produced by Tessera Corporation. The Micro BGA is a compliant flexible material for applying a VLSI chip to a mounting surface. Another type of chip package attaches a VLSI chip directly to a motherboard of a computer without a complicated package having connectors. Furthermore, reference will be made to different types of materials used in VLSI chip packages such as ceramic, organic, plastic and other materials. The present invention is in no way limited to any particular type of VLSI chip package, any type of package, any material that may be used, or any type of circuit in which a package may be integrated. Furthermore, the mechanical configurations described can take on many forms when custom made to conform to a particular system for mounting and electrical connection. The forms described in the text and illustrated in the drawings are intended for illustration purposes only and are in no way intended to limit the scope of the invention.

Reference will be made to a computer chassis wherein various configurations of the present invention are employed. The use of a computer system is intended only for illustrative purposes and is not intended to limit the present invention to the environment of a computer system. A VLSI chip package such as a microprocessor chip package can be mounted described below on a computer chassis or a desk top computer system, a notebook or laptop computer, or many other types of personal computer systems or work stations. Furthermore, the present invention can be employed in mounting many other types of VLSI chips including, but not limited to, microprocessors on other types of system framework that could provide a heat dissipation source or a current supply as described below. Therefore, it is not intended to limit the present invention to the environment of any particular type of system or apparatus. Therefore, reference is made to the claims set forth below that set forth the true spirit and scope of the invention.

Figure 6A:
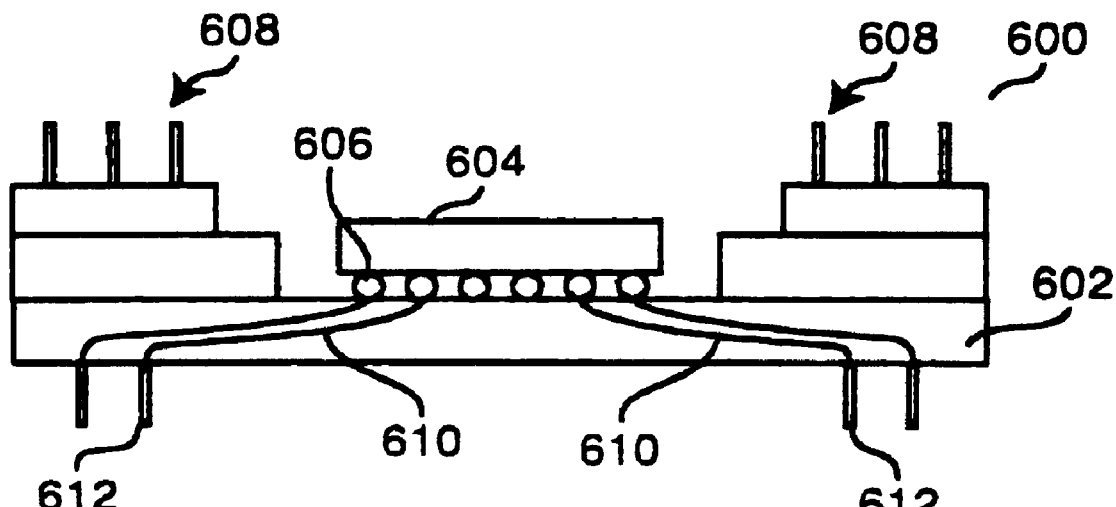
FIG. 6A is a block representation of a pair of VLSI chip packages configured to be mounted on a computer chassis in accordance with one embodiment of the present invention.

Referring now to FIG. 6A a first embodiment of the present invention is illustrated. A VLSI chip package having a base 602 with a VLSI chip 604 mounted thereon via soldering bumps 606. Also included are signal pins 608 connected to the chip via pin circuitry 610 for external connection of the VLSI chip to a computer system. Power and ground connections 612 may be pins, a solid metal plate or other methods to provide a conductive connection to a computer chassis as discussed below. It will be appreciated by those skilled in the art that many configurations of pin circuitry 610 are possible given different types of VLSI chips, packages and system mounting configurations. Thus, the present invention as described herein is not limited to any one configuration.

Figure 6B:
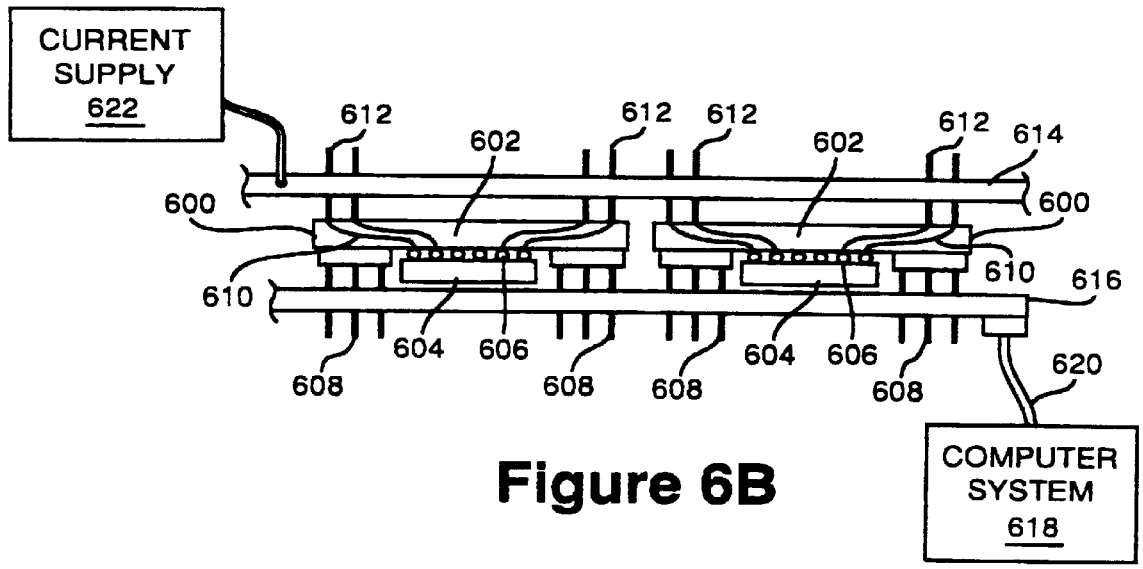
FIG. 6B is a block representation of the VLSI chip packages of FIG. 6A mounted on the back plane of a computer chassis.

Referring to FIG. 6B, a pair of VLSI packages 600 are shown mounted on the back plane of a computer chassis 614 and interconnected through interconnection circuit 616 and connected to computer system 618 via bus connection 620. Throughout the specification reference will be made to interconnect circuitry such as interconnection circuit 616 of FIG. 6B. Details of the interconnection circuitry is discussed in further detail below in connection with FIGS. 11 and 12.

Still referring to FIG. 6B, power connections 612 are mounted and electrically coupled to the computer chassis 614, which is mounted to current supply 622 to provide power to the VLSI chip packages 600. In this embodiment, either supply or ground current can be supplied to the VLSI chip packages via the computer chassis giving the advantage of a low resistance connection to the current supply 622 at a much lower inductance than a power cable that would typically be used to supply power from the current supply 622 to the VLSI chip packages 600 in the prior art. Thus, one embodiment of the present invention in the configurations shown in FIG. 6B provides a low resistance, low inductance connection between the current supply 622 and the VLSI chip package 600.

Figure 6C:
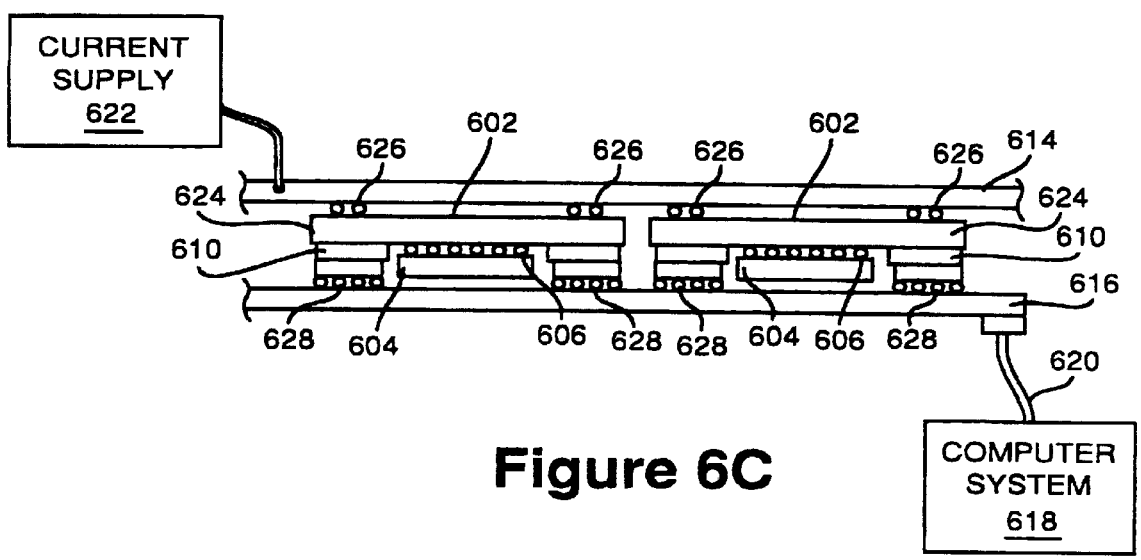
FIG. 6C is a block representation of a VLSI chip package configured to be surface mounted to a computer chassis and interconnection circuit in accordance with one embodiment of the present invention.

Referring now to FIG. 6C, an alternative embodiment to FIG. 6A provide a pair of surface mounted chip packages 624 for flush surface mounting and electrical coupling between the VLSI chip packages 624 and the computer chassis 614 to provide a connection between the current supply 622 and the chip packages 624. Chip packages 624 are shown mounted on one side to the computer chassis via soldering bumps 626, providing a flush surface mount of the chip package 624 to the computer chassis 614 without the need for connecting pins 612 of FIG. 6B. Also illustrated in FIG. 6C are soldering bumps 628 for coupling signal lines from chip package 624 to interconnection circuit 616, providing a path for data and instruction signals between the VLSI chip package 624 and computer systems 618. The use of surface mounting eliminates the need for the pin connections such as 608, 612 of FIG. 6B, avoiding the risk of damaging the pins in production to providing a more sure connection of the package 624 to both the interconnect circuitry 616 and the computer chassis 626. Unlike the prior art of FIG. 1C discussed above, FIG. 6C shows how soldering bumps can be used to connect signal and power connections to the computer system in accordance with the present invention.

Figure 7A:
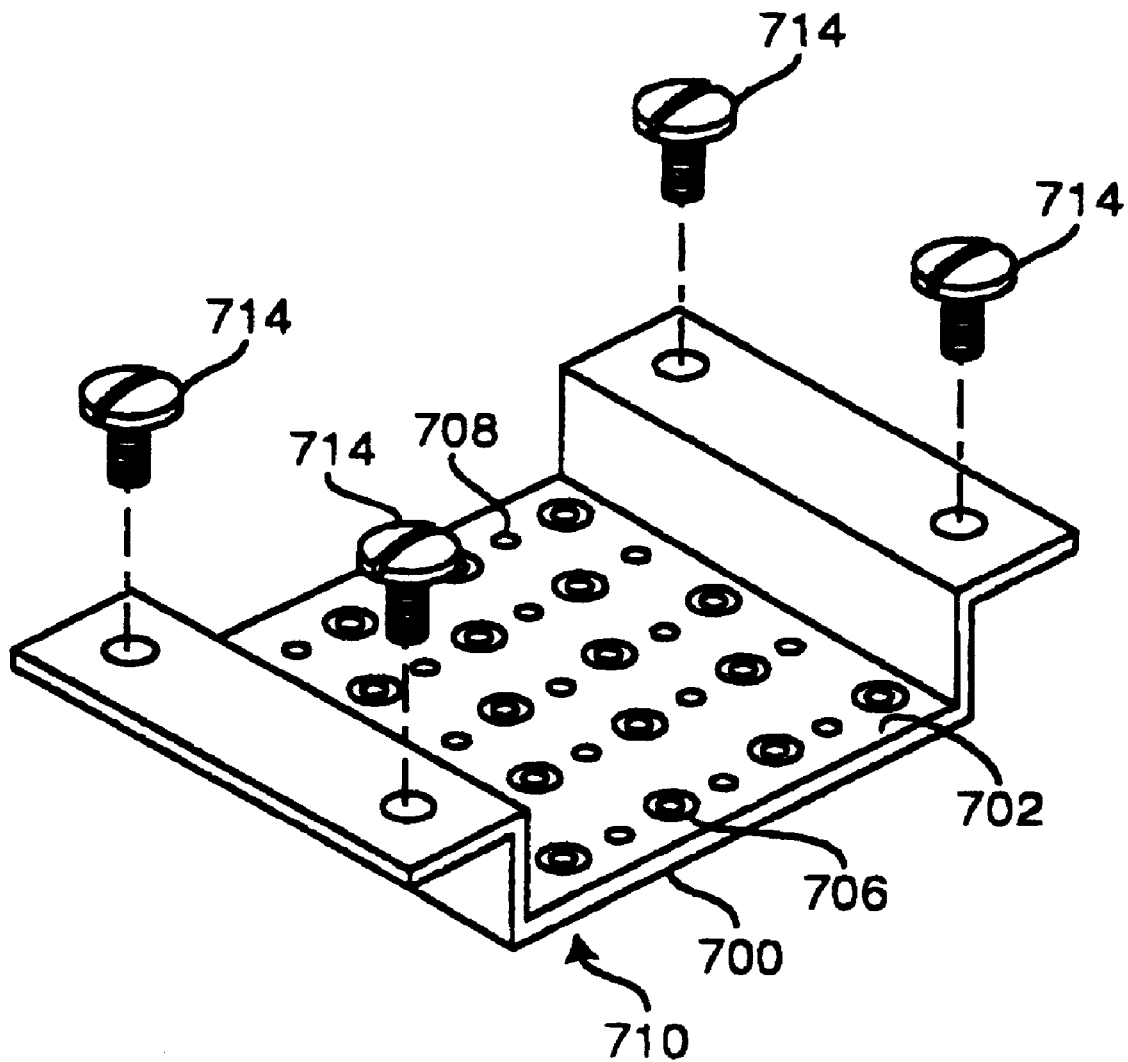
FIG. 7A is a bracket configured to retrofit a VLSI chip package to be mounted on the back plane of a computer chassis in accordance with one embodiment of the present invention.

FIG. 7A illustrates a bracket configured to mount a conventional VLSI chip package to a computer chassis in order to supply current to the VLSI chip package via the computer chassis in a similar manner as the configuration of FIG. 6B. Unlike the configuration of FIG. 6A, which is a VLSI chip package custom made to be mounted on a computer chassis. FIG. 7A illustrates a retrofit mechanism to mount conventional VLSI chip packages to computer chassis. The brackets 700 include a mounting surface 702 having a plurality of sockets 706, 708 including insulating sockets 706 and coupling sockets 708. In this configuration, sockets 706, 708 can be designed to receive each and every pin of a VLSI chip package so that a predetermined number of pins can be coupled to the brackets 700 via coupling pins 708 by electrically coupling a pin to a coupling socket 708. Similarly, other pins can be electrically insulated from the brackets 700, by protruding the pin through insulating sockets 706, allowing the pin to pass through to the surface of the brackets 700 and couple to another electrical connection on the other side.

Figure 7B:
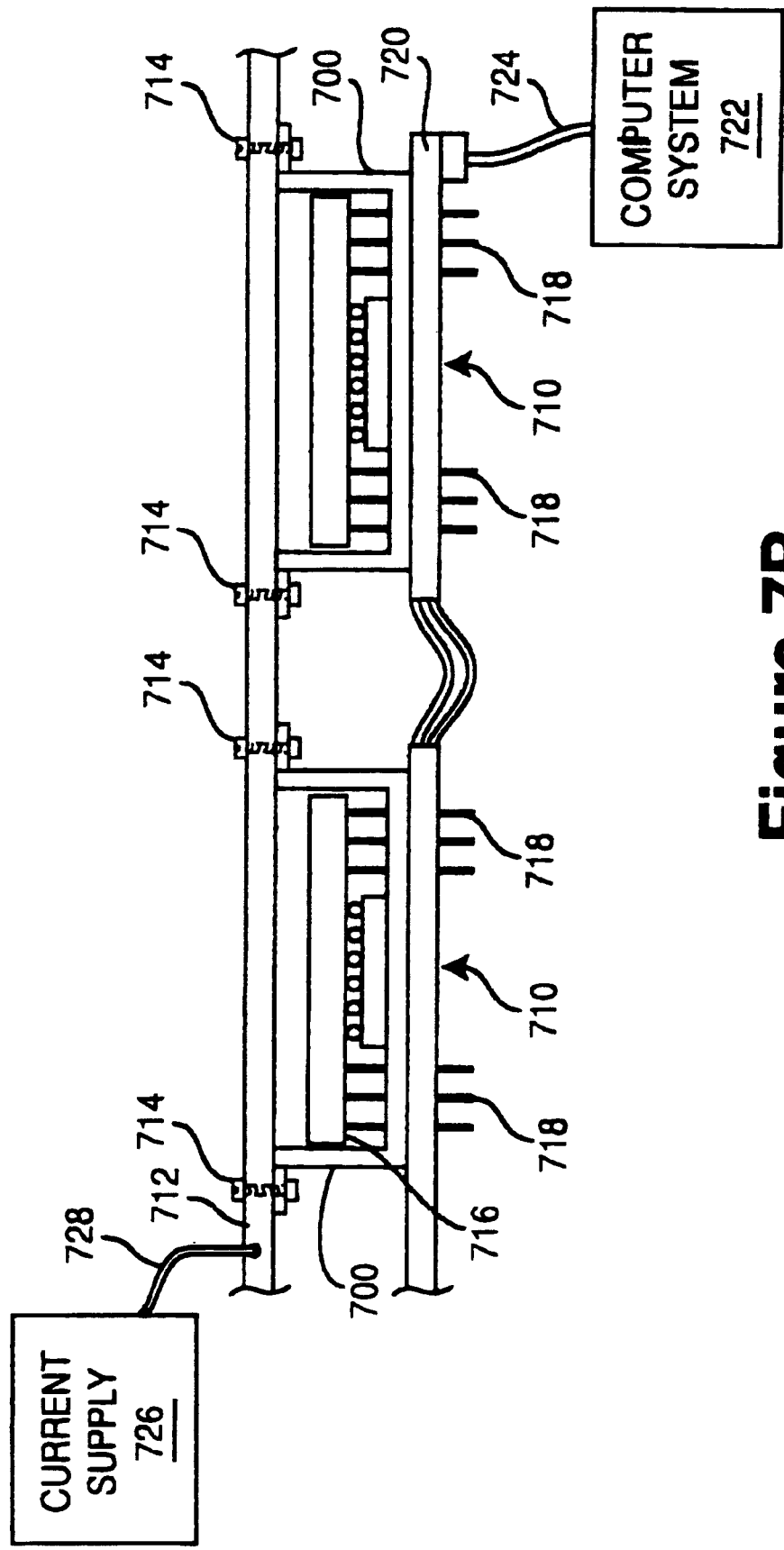
FIG. 7B is a block representation of a pair of VLSI chip packages mounted on the back plane of a computer chassis using the bracket of FIG. 7A in accordance with one embodiment of the present invention.

This feature is more clearly illustrated in FIG. 7B, which shows a pair of brackets 700 mounted to the back side of a computer chassis 712 via fastener 714. It will be appreciated by those skilled in the art that a variety of different fasteners 714 can be implemented to mount the brackets 700 to the computer chassis 712 including screws, rivets, spot welds, soldering, etc. VLSI chip packages 716 are shown mounted in the brackets 700 with the power and signal pins 718, protruding through the bottom surface 710 of the brackets 700 and also protruding through the interconnection circuit 720 for ultimate connection to computer system 722 via connector 724.

The power and signal pins 718 protrude through sockets 706, 708 of brackets 700 and are either coupled to the brackets 700 through coupling sockets 708 (FIG. 7A) or protrude through insulating sockets 706 (FIG. 7A) that extend out from bottom surface 710 without electrical connection to the brackets 700, so that the pin 718 can be coupled to the interconnection circuit 720 independent of the bracket. In accordance with the present invention, power or ground pins are connected to the bracket via coupling sockets 708 to provide a connection between the current supply 726 coupled to and providing power for the computer chassis 712 via power connection 728. Also, in accordance with the present invention, signal pins included in the power and signal pins 718 can protrude through electrically isolated insulating sockets 706 and can be electrically coupled to interconnection circuit 720 for receiving instruction and data signals from computer system 722 via the interconnection circuit 720. It will be appreciated by those skilled in the art that different configurations of pins will exist for different VLSI chip packages and, accordingly, the bracket 700 would have to be configured to receive a particular VLSI chip package to provide power connections from the current supply 726, via connection 728, chassis 712 and bracket 700.

Figure 1D:
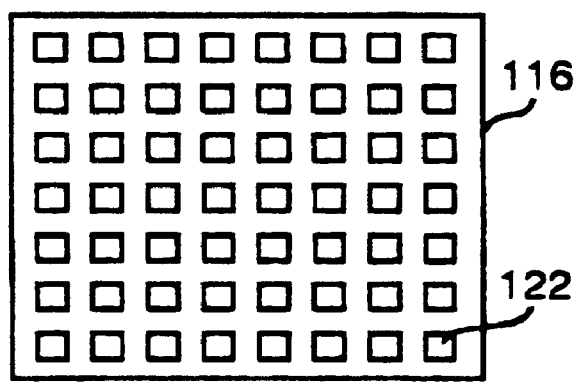
FIG. 1D is a top view of the VLSI silicon chip of FIG. 1c.
Figure 2:
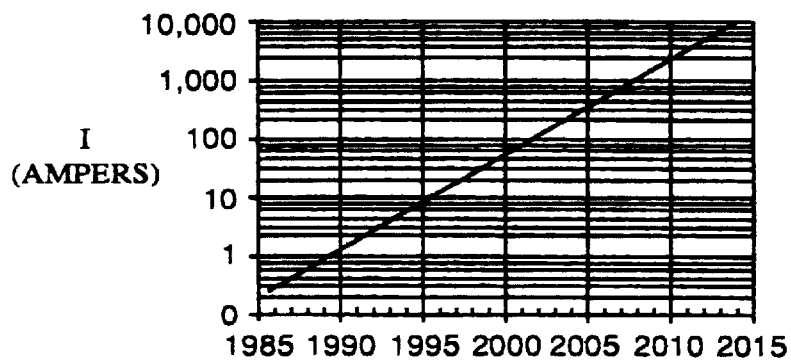
FIG. 2 is a logarithmic graph representation of current demands of microprocessors past, present and future.
Figure 3:
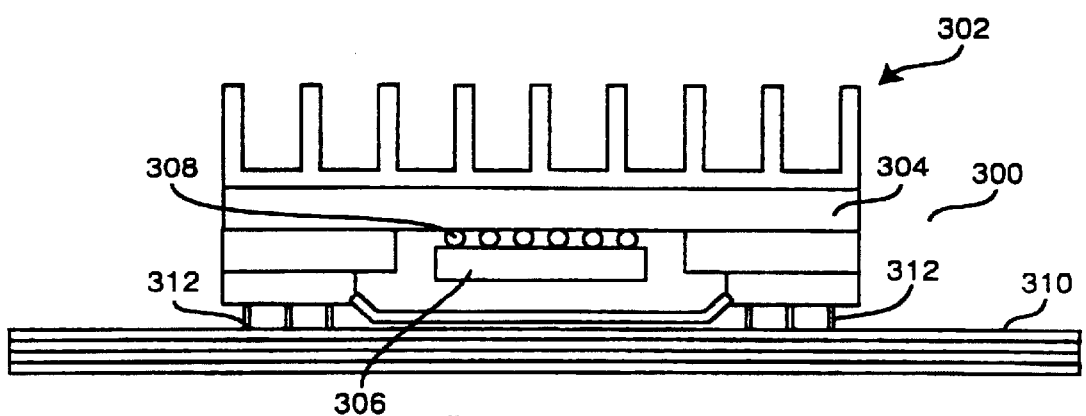
FIG. 3 is a block representation of a VLSI chip package of the prior art having cooling fins and mounted on a mother board.
Figure 4:
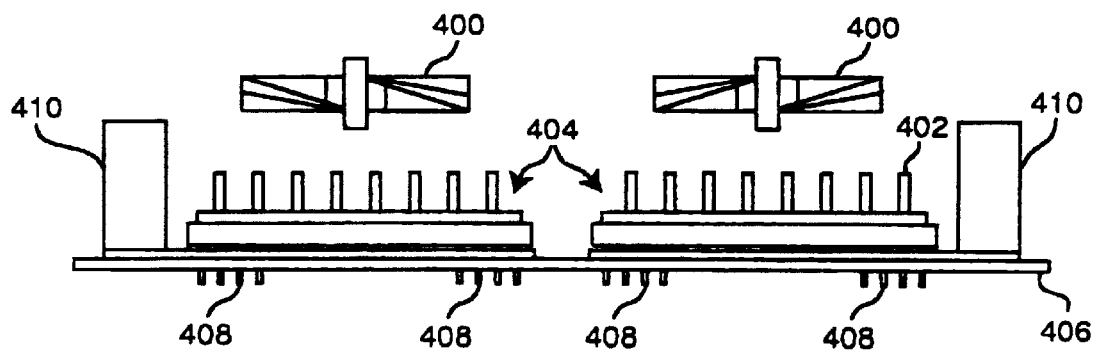
FIG. 4 is a block representation of a VLSI chip package configuration as it might be mounted in a computer system in the prior art.
Figure 7C:
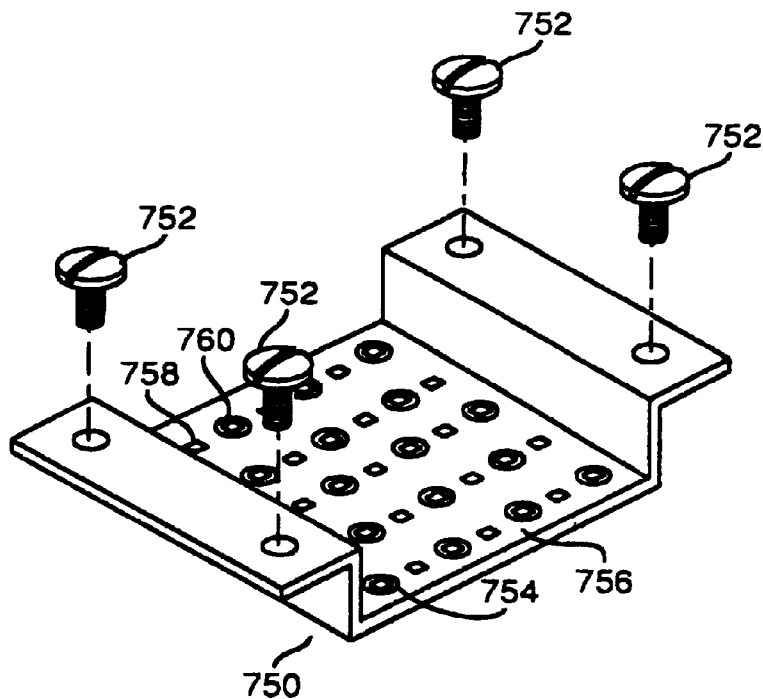
FIG. 7C is an alternate embodiment of the bracket of FIG. 7A configured to surface mount a VLSI chip package to the back plane of a computer chassis in accordance with one embodiment of the present invention.
Figure 7D:
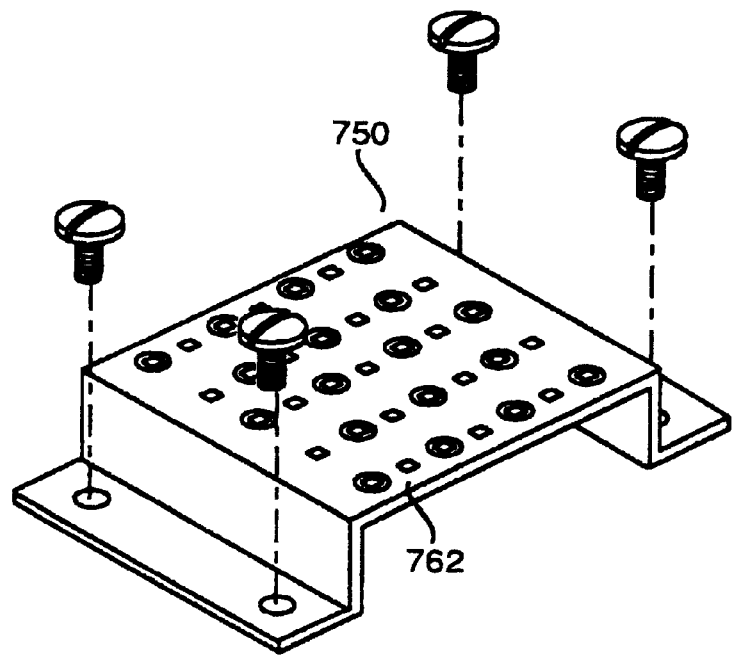
FIG. 7D is a top view of the bracket of FIG. 7C.

FIG. 7C is an alternative embodiment of the bracket of FIG. 7A and is configured to receive VLSI chip packages designed for surface mounting through a printed circuit board. Such a configuration will be similar to the VLSI chip package illustrated in FIGS. 1C and 1D. In the configuration shown in FIG. 7C, a bracket 750 is shown with fastener 752 for mounting on the computer chassis (not shown) and has landing pads 754 located on inside surface 756 for receiving a VLSI chip package designed for surface mounting and electrical coupling to the landing pads 754 through soldering bumps or other similar electrical connections (not shown). Similar to the configuration of FIG. 7A, the surface mounting configuration of 7C has coupling landing pads 758 for electrical coupling of the landing pads from VLSI chip package (not shown) to the corresponding landing pad on the surface 756 to provide a power connection from a current supply through a computer chassis and the bracket 750 and ultimately to the VLSI chip package to be connected to landing pad 758. Also provided on the bracket 758 are isolated landing pads 760 that extended through a bottom surface 762 shown in FIG. 7D, that exposes the landing pad to the exterior surface of the bracket 750 when mounted on a computer chassis. The back side 762 of the bracket 750 can also have connecting pins (not shown) as an alternative method of connecting signal pins from the chip, through the bracket, and extending from the back surface 762 for ultimate connection to an interconnecting circuit, such as the circuit 720 shown in FIG. 7B.

Figure 7E:
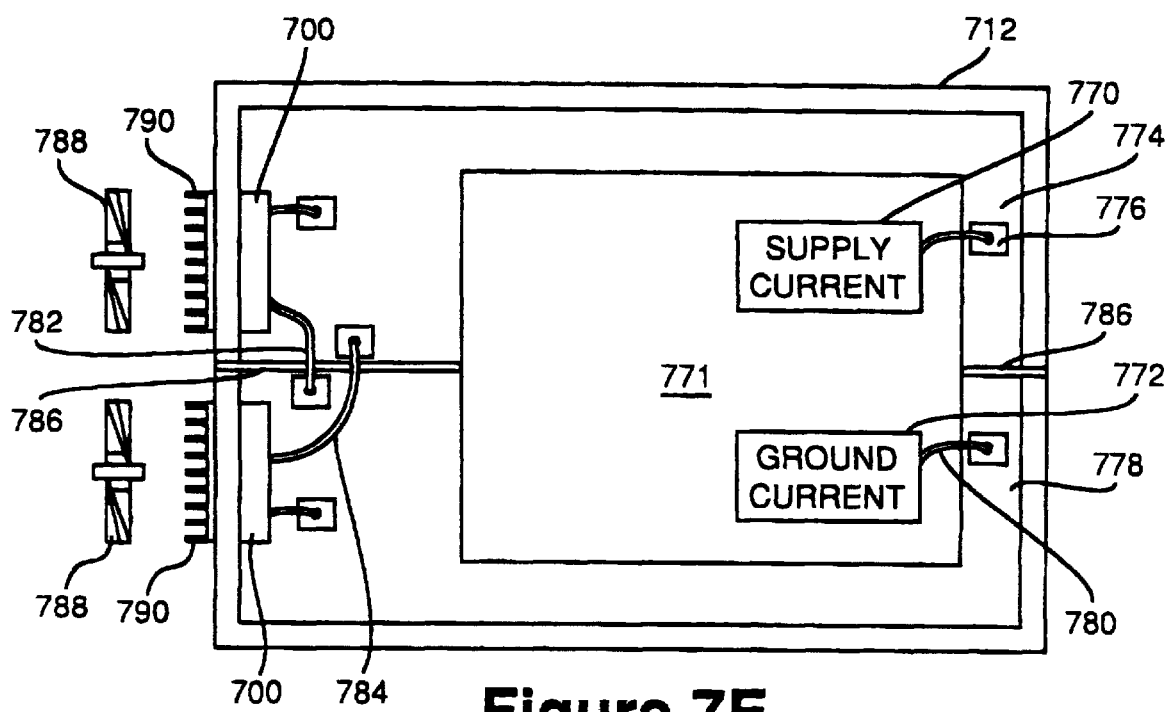
FIG. 7E is a block representation of another configuration for mounting a VLSI chip package on a computer chassis for a current supply in accordance with one embodiment of the present invention.

Referring now to FIG. 7E, an alternative configuration is shown for supply current 770 and ground current 772 to VLSI chip packages 700. In this configuration, the chassis 712 is divided into a first section 774 that is electrically coupled to the supply current 770 mounted on motherboard 771 as the connection cable 776. Also included is a second section 778 directly coupled to ground current source 772, also mounted on the motherboard 771, via electrical connecting cable 780. It would be appreciated by those skilled in the art that many supply current, ground current and cable connections exist in the art and that many different techniques exist in order to couple such current supplies. However, it is important to note that connections should be as short in length as possible in order to reduce resistance and inductance effects on the circuit. Connection cables 782, 784, provide electrical connections between the VLSI chip packages 700 and each respective chassis section 774, 778 to each VLSI chip package 700. The chassis sections 774, 778 are electrically isolated via isolating barrier 786, which divides portions of the computer chassis, keeping the supply current source 770 electrically isolated from ground current source 772 when each are connected. This configuration provides electrical coupling of each VLSI chip package to supply and ground current supplies via the electrically isolated sections of the chassis 712. Also shown in FIG. 7E are the cooling configurations 788, 790 discussed in more detail below.

The configuration shown in FIGS. 6A through 7E are intended for illustrative purposes only. Many different configurations that fall within the spirit and scope of the invention as described above and claimed below, can be derived from these illustrations in order to fit a particular application. Such derivative forms of the above described configurations were not to part from the spirit and scope of the present invention as described above and claimed. Therefore, the present invention should not be limited by these illustrative configurations.

HEAT DISSIPATION

Figure 8:
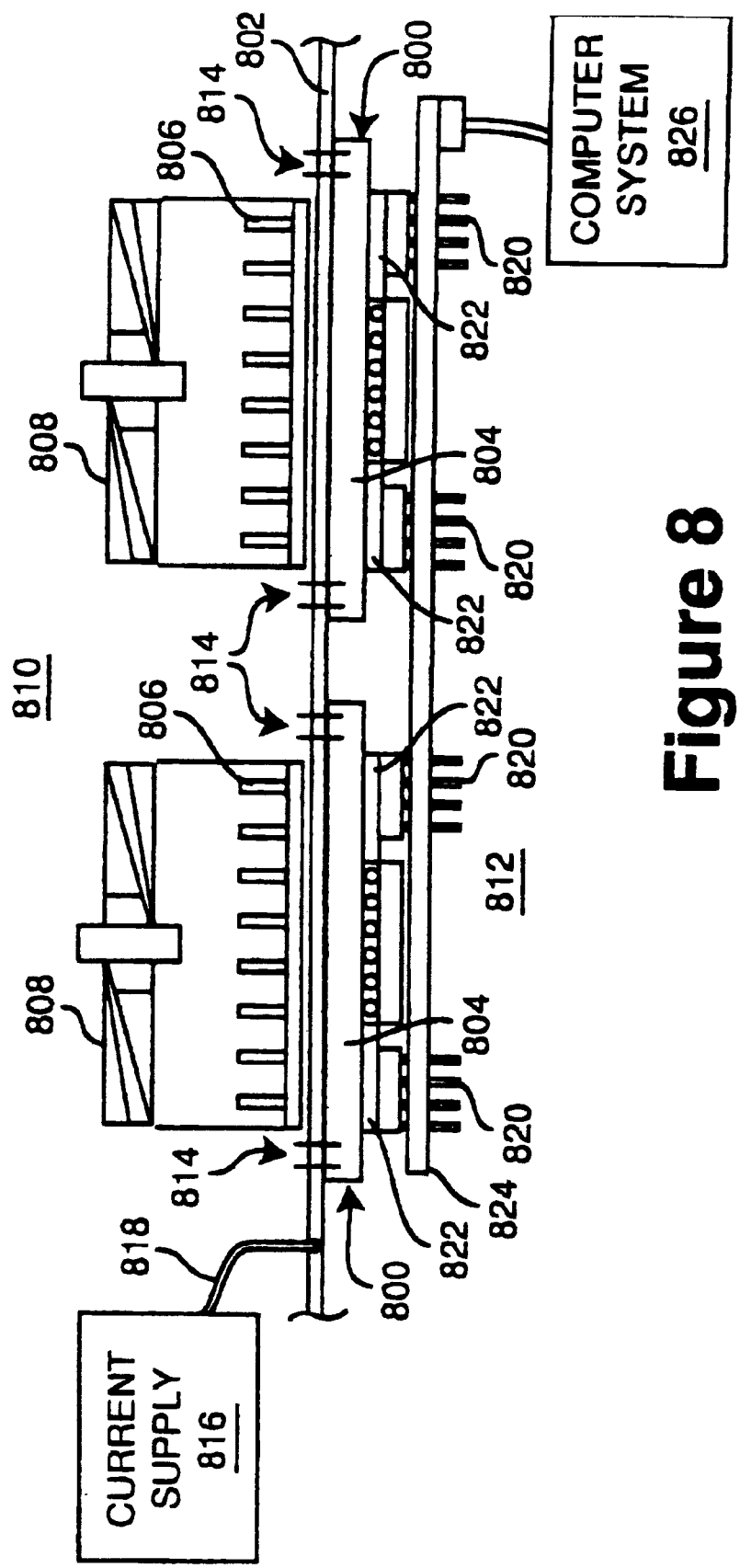
FIG. 8 is a block representation of a pair of VLSI chip packages mounted on the back plane of a computer chassis for cooling in accordance with one embodiment of the present invention.

Considering that cooling is becoming a major concern in VLSI chip package design, a second embodiment of the present invention is provided and illustrated in FIG. 8. A pair of VLSI chip packages 800 are shown mounted in computer chassis 802 via fastening means (not shown). The VLSI base 804 is shown flush mounted to the computer chassis 802 in a thermally conductive manner. This thermally conductive manner could include simply flush mounting ceramic, plastic, organic or metallic (as the case my require) surface of a base 804 through an electrically conductive chassis 802 to provide heat dissipation from the VLSI chip via the ceramic base 804 and chassis 802. It will be appreciated by those skilled in the art that many thermal couplings can exist between the chip packages 800 and chassis 802. These can include the coupling of a ceramic, plastic, organic or metallic package to the conductive surface of the chassis 804, application of adhesives or other conductive mediums, such as silicone grease (not shown), to improve the thermal coupling between the package 800 and chassis 802 and other various coupling methods. Therefore, it is not intended that the present invention be limited to any such coupling methods.

Additionally, cooling fins 806 can be mounted on the chassis 802 within a proximity of the VLSI chip packages 800 to provide additional heat dissipation from the VLSI chip packages 800 through the bases 804 and chassis 802. Still further, cooling fans 808 can be mounted in proximity to the cooling fins 806 to provide even further cooling the VLSI chip packages through the bases 804, chassis 802, cooling fins 806, cooling fans 808 and ultimately the outside ambient 810 exterior to the computer chassis 802. Although heat would be generated in the inside ambient 812 of the computer chassis as a result of internal components as well as VLSI chip packages 800, heat from the VLSI chip packages 800 will be more efficiently dissipated to the outside ambient 810 in this configuration.

Optionally, the configurations discussed above in connection with FIG. 6A through 7E can be employed in combination with this cooling configuration illustrated in FIG. 8 to provide current supplies to the VLSI chip packages as discussed above. Still referring to FIG. 8, power connection pins 814 are shown extending from the VLSI chip package 800 and protruding through the computer chassis 802 in order to form a connection between current supply 816 and the VLSI chip packages 800 through interconnection circuitry 824 and ultimately to the computer system 826 to provide data and instruction signals between the VLSI chip packages 800 computer system 826.

Figure 9A:
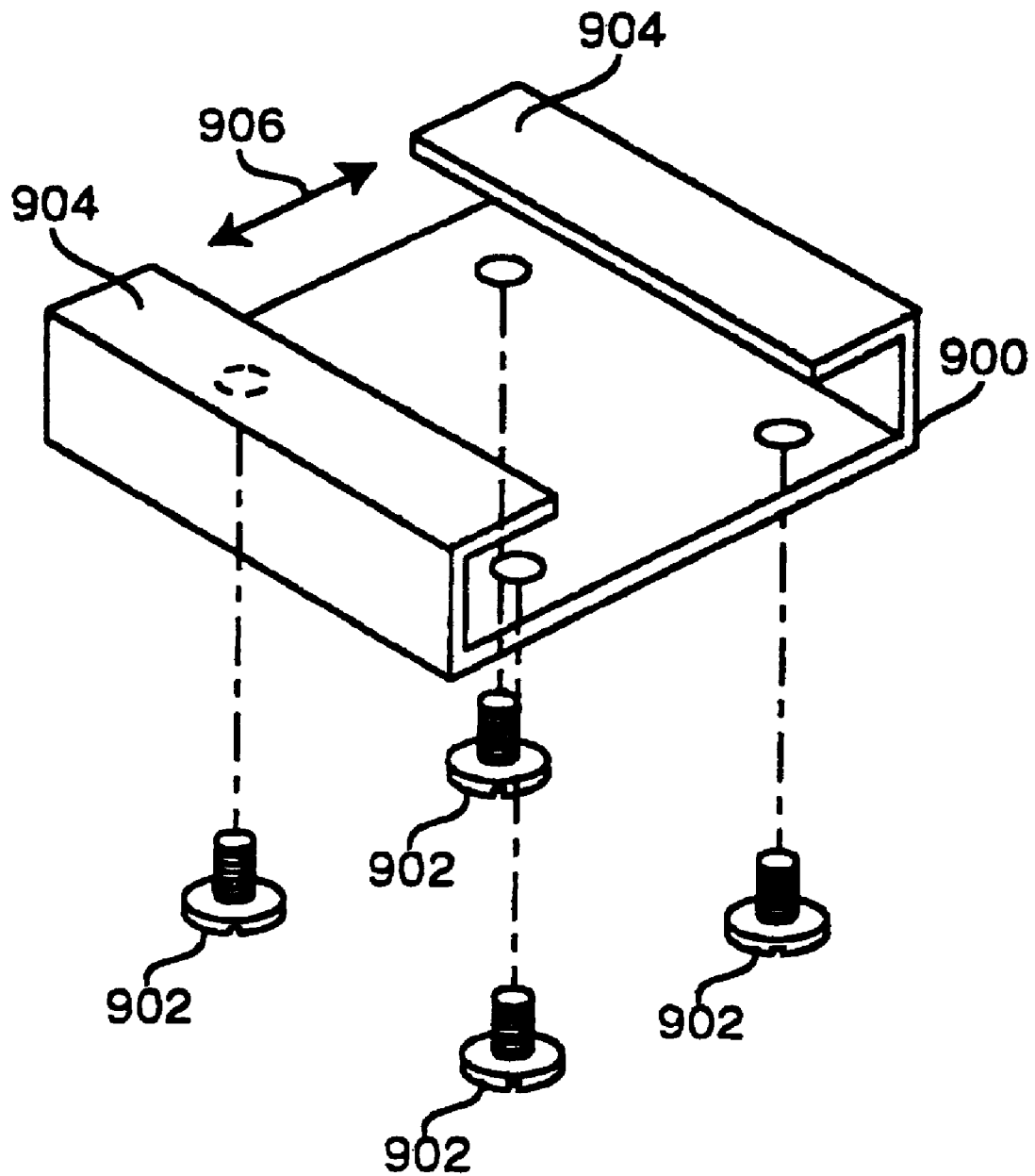
FIG. 9A is a bracket configured to retrofit a computer chip to mount on a back plane of a computer chassis for cooling in accordance with one embodiment of the present invention.

Referring now to FIG. 9A, a bracket 900 is shown having fasteners 902 for ultimate connection to a computer chassis or other type of frame (not shown). Bracket 900 has a pair of L bracket portions 904 for holding a conventional VLSI chip package designed for surface mounting on a printed circuit board. The bracket is able to hold the VLSI chip package in place and to make a thermal connection between the bracket 900 and a VLSI chip package. The bracket 900 would typically be made of a thermally conductive material, such as copper, aluminum or steel, to provide dissipation of heat from the base of a VLSI chip package to bracket 900. The open area 906 between the brackets 904 provide space for connection pins to protrude therefrom for ultimate connection to the electrical connection circuitry illustrated in FIG. 8.

Figure 9B:
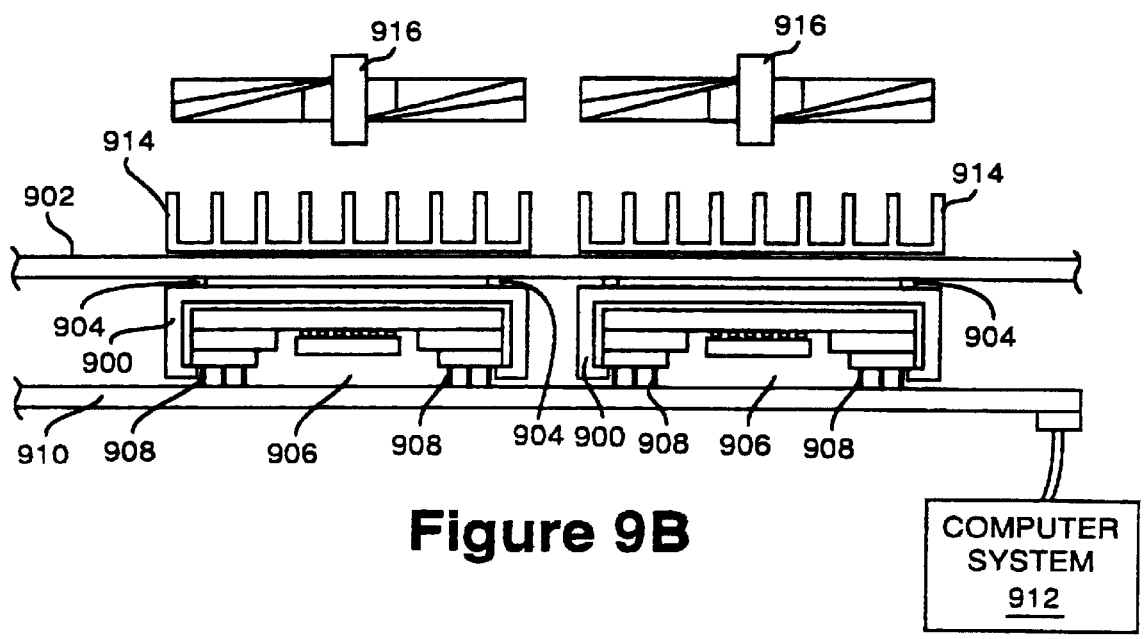
FIG. 9B is a block representation of two brackets of FIG. 9A shown mounted with a pair of VLSI chip packages on the back plane of a computer chassis with optional cooling fins and cooling fans in accordance with one embodiment of the present invention.

Referring now to FIG. 9B, a block illustration is shown of the bracket 900 mounted on a chassis 902 with fasteners 904. VLSI chip packages 906 are shown partially encapsulated by brackets 900 with power and signal pins 908 exposed for connection to interconnect circuitry 910 which is coupled to the computer system 912 to provide signal and possibly power connections between VLSI chip packages 900 and the computer system 912. Further illustrated in FIG. 9B are optional cooling fins 914 and cooling fans 916 located on the exterior of the computer chassis 902 and located in proximity to the mounted brackets 900. This configuration provides for conventional VLSI chip packages to be mounted on the chassis of a computer system 912 or any other type of mounting frame.

Figure 10A:
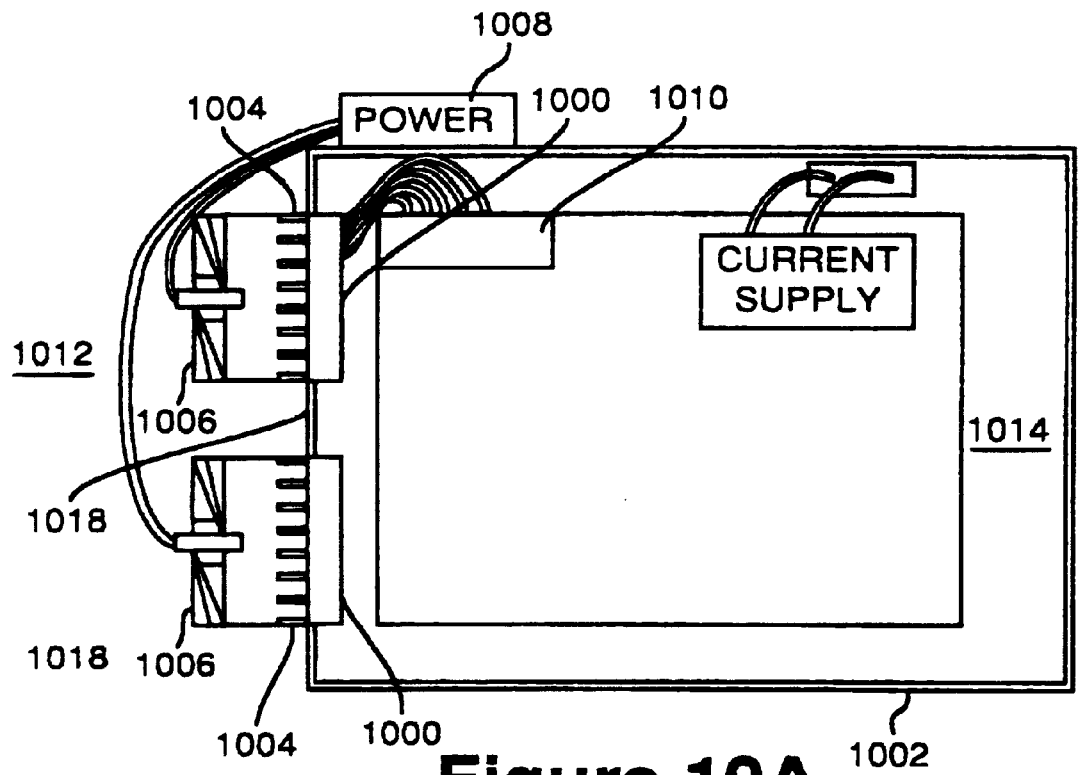
FIG. 10A is a block representation of the mounting configuration of FIG. 9B from a top view.

Now referring to FIG. 10A, a top view of VLSI chip packages 1000 are shown mounted on a computer chassis 1002. Cooling fins 1004 are mounted on the exterior of the computer chassis 1002 in a proximity to the VLSI chip packages 1000. Mounted on the cooling fins 1004 are cooling fans 1006 connected to power source 1008. Also illustrated is interconnection circuitry 1010 coupled to VLSI packages 1000. As can be seen, the VLSI chip packages 1000 are in a location that allows dissipation of heat from the VLSI chip packages 1000 through the computer chassis 1002, the cooling fins 1004, the cooling fans 1006 and ultimately out to the ambient 1012 outside the computer chassis 1002. Although heat is generated by the VLSI chip packages 1000 on the interior ambient 1014 of the computer chassis 1002, heat is dissipated through the computer chassis 1002, fins 1004 and fans 1006 to the exterior ambient 1012 efficiently.

Figure 10B:
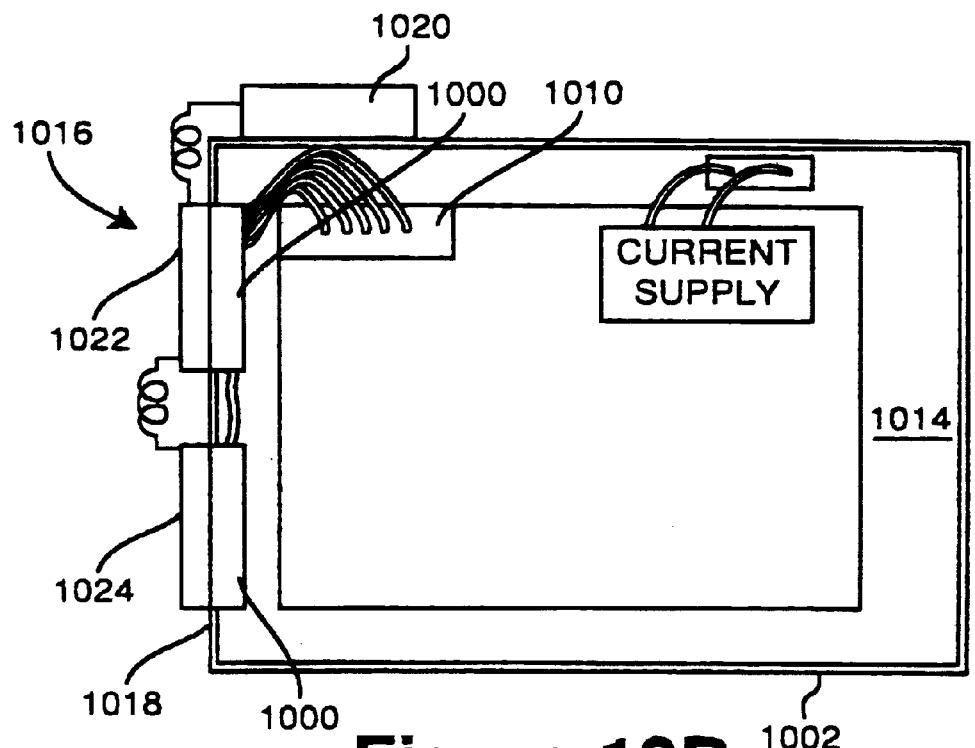
FIG. 10B is an alternative configuration to FIG. 10A showing liquid cooling of the chassis mounted VLSI chip packages in accordance with one embodiment of the present invention.

Referring now to FIG. 10B, an alternative cooling system is illustrated. As in the configuration of FIG. 10A, VLSI chip packages 1000 are mounted on computer chassis 1002. As discussed above in accordance with relation to FIGS. 8, 9A and 9B, various methods are provided in the present invention mounting the VLSI chip packages 1000 to the computer chassis 1002. Unlike the configuration in FIG. 10A, however, a liquid cooling system 1016 is shown mounted on the back plane of 1018 of the computer chassis proximate in location to the VLSI chip packages 1000. Cooling liquid generator 1020 showed mounted on the chassis 1002 towards circulating cooling liquid to cooling dissipation units 1022, 1024. It will be appreciated by those skilled in the art that many devices exist for providing liquid cooling in capacity to dissipating heat in this configuration. Therefore, it is not intended to limit the present invention to any particular or well known method for providing liquid cooling in this manner.

Figure 11A:
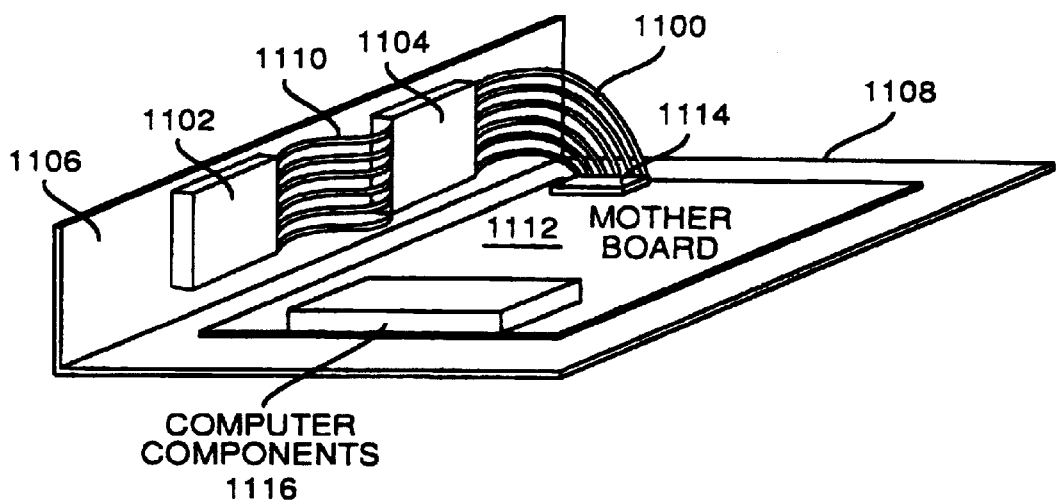
FIG. 11A is a perspective view of a point-to-point interconnect configuration using flexible interconnect in accordance with one embodiment of the present invention.

Referring now to FIG. 11A, a perspective view of interconnection circuitry 1100 is illustrated. VLSI chip packages 1102, 1104 are shown mounted on the back plane 1106 of computer chassis 1108 for receiving the benefits of cooling means and current supplies from the computer chassis 1106 as discussed above. The interconnect circuitry 1100 includes interconnect bus lines 1110 connecting VLSI chip packages 1102, 1104 for transmitting data between the processors. The protocol related to such communication includes well known protocols in the art such as those discussed in U.S. Pat. application "Microprocessor Point-To-Point Communication" of Self et al., "Point-To-Point Phase-Tolerant Communication" of Self et al., and U.S. Pat. No. 5,546,023 of Borkar et al. Such a configuration provides signal transmission integrity between VLSI chip packages 1102, 1104 and the motherboard 1112 via connection 1114 to provide communication to the computer components 1116 monitored on the motherboard 1112.

Figure 11B:
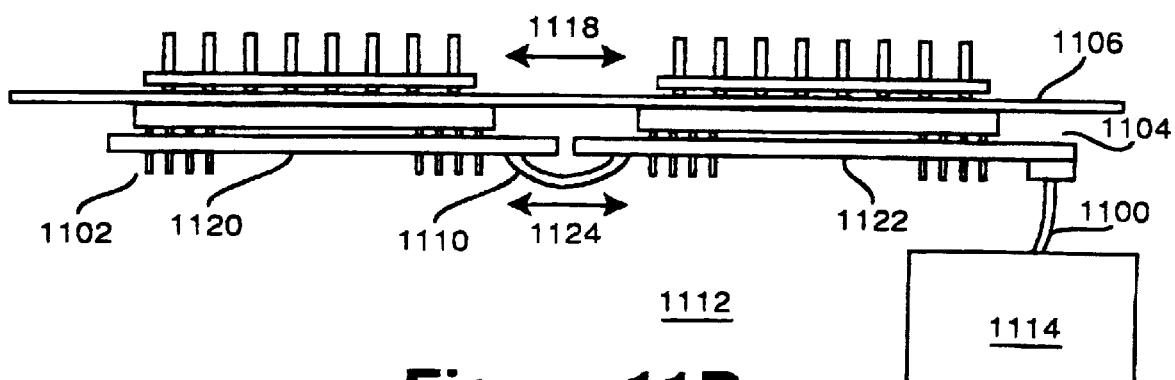
FIG. 11B is a top view of a pair of VLSI chip packages mounted on a computer chassis and communicating through a flexible interconnect in accordance with one embodiment of the present invention.

Referring now to FIG. 11B, a top view of the configuration shown in FIG. 11 is shown. Lines 1110 are flexible data communication lines that are able to move with the movement of the VLSI chip packages 1102, 1104. When the VLSI chip packages heat up, the back plane 1106 expands in horizontal direction 1118, possibly moving the VLSI chip packages 1102, 1104 away from each other. If the interconnect circuitry between the processors 1120, 1122 were not flexible, the movement of the chips in horizontal direction 1124 could be different than the distance of movement and direction 1118 of the back plane 1106. This could cause damage in the communication lines 1110, breaking off lines of communication. For this reason, flexible connections interconnect circuitry 1100, 1110 are preferred.

Figure 12A:
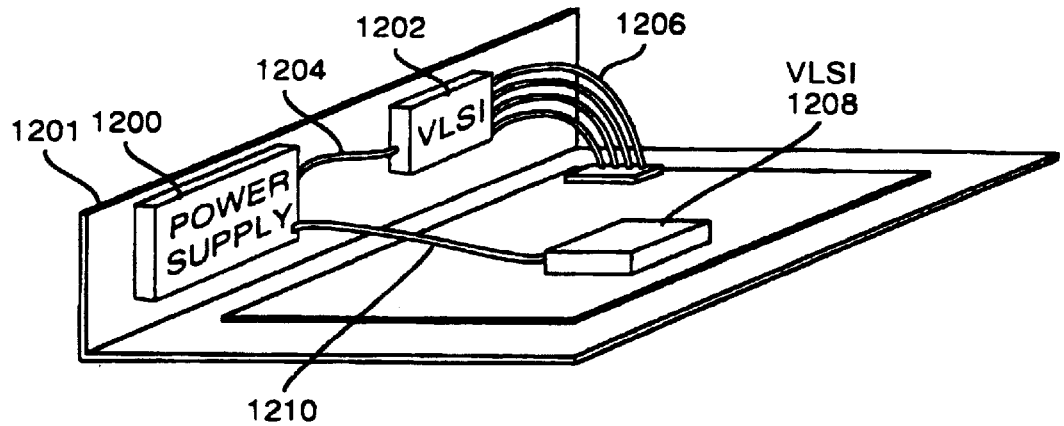
FIG. 12A is a perspective view of a power supply mounted on a computer chassis for cooling the power supply while supplying power to a VLSI chip package.
Figure 12B:
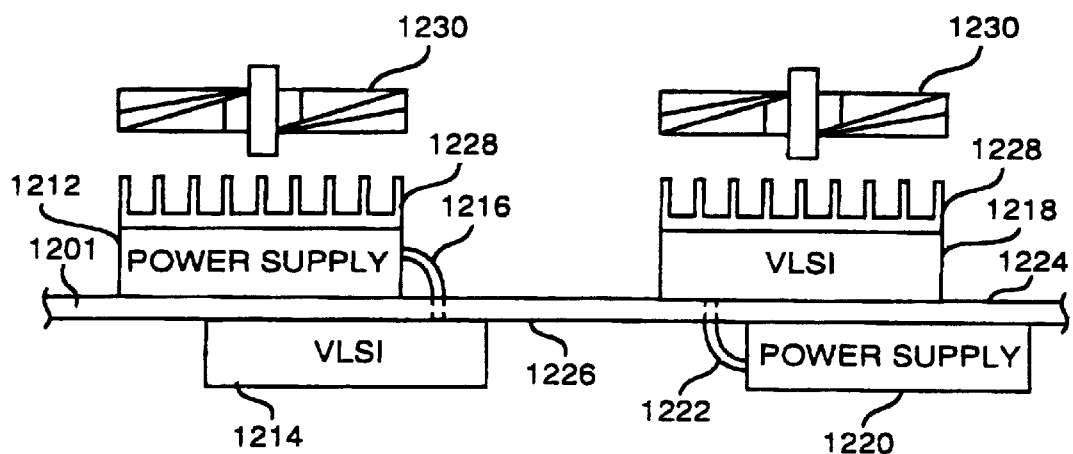
FIG. 12B is a top view illustrating two different configurations for mounting a power supply on the back chassis of a computer.

Power supplies that supply power to VLSI chip packages such as microprocessors use a great deal of heat in a computer system where it is utilized. A configuration for cooling a power supply in the same manner as discussed above with respect to the VLSI chip packages would be useful. Such a configuration is shown in FIGS. 12A and 12B. This configuration would be an ideal application for a Power-Pod Power Delivery System, such as that disclosed in related U.S. application Ser. No. 08/672,864 cited above.

Referring first to FIG. 12A, a perspective view of a power supply mounted on a computer chassis is shown. Power supply 1200 is shown mounted on computer chassis 1201 by methods similar to that discussed above with the VLSI chip packages mounted on the computer chassis. Power supply 1200 is connected to VLSI chip 1202 via power connector 1204 for supplying power to the VLSI chip package 1202. Alternatively, the power supply 1200 can supply power through a VLSI chip 1208 mounted on a motherboard 1209 while still taking advantage of the cooling features resulting from the power supply 1200 mounted on the chassis 1201. The power supply 1200 can also be configured to supply power to multiple VLSI chip packages mounted anywhere in the computer system. Interconnect circuitry 1206 such as that discussed above with respect to FIGS. 11A and 11B, can be utilized to transfer data and information signals between the VLSI chip package and the motherboard 1209. This configuration allows for the cooling of the power supply 1200 in the same manner as cooling of VLSI chip package 1202 as discussed above.

Referring now to FIG. 12B, alternative configurations for mounting power supplies 1212, 1220 and VLSI chip packages 1214, 1218 are illustrated. As illustrated here, the power supplies 1212, 1220 can be mounted either on the outside surface 1224 of computer chassis 1201 or the inside surface 1226. The same is true for VLSI chip packages 1214 and 1218. In one configuration, power supply 1212 is mounted on a computer chassis 1201 in a manner to thermally dissipate heat from the power supply 1212 through computer chassis 1201. Power is supplied to VLSI chip package 1214 via power connection 1216 through the chassis 1201. In another configuration, VLSI chip package 1218 is mounted on the backside 1224 of the computer chassis 1201 and receives power via power connection 1222 from the power supply 1220 through the computer chassis 1201. In an alternative embodiment not shown, the power supply and VLSI chip package can both be mounted and connected together on either side of the computer chassis 1201. It will be appreciated by those skilled in the art that different configurations are possible given different application requirements. Other arrangements and configurations did not depart from the spirit and scope of the present invention as claimed below. Cooling fins 1228 and cooling fans 1230 can also be implemented with power supply 1212 and VLSI chip package 1218 in order to provide further cooling of the system components using methods such as those discussed above.

From the above description, it will be apparent that the invention disclosed herein provides a novel and advantageous method and apparatus for mounting a VLSI chip package to a computer chassis or other type of frame in order to provide cooling means and a current supply to the VLSI chip package. As will be understood by those familiar in the art, the invention may be embodied in other specific forms without departing from its spirit or central characteristics, and thus, the described embodiments set forth above is not restrictive of the scope of the invention. The following claims are indicative of the scope of the invention, and all variations which come within the meaning and range of equivalency of the claims are to be embraced within their scope.

We claim:

1. An apparatus, comprising:
   a Very Large Scale Integration (VLSI) chip package mounted to a conductive chassis, wherein the VLSI chip package has supply and ground current inputs;
   a mount that mounts the VLSI chip package to a conductive chassis wherein the chassis is divided into multiple sections and wherein the mount is configured to mount on the chassis with the supply current input coupled to one section of the chassis and wherein the ground current input is coupled to another section of the chassis;
   a first fastener that couples the mount to the chassis;
   a second fastener that couples the VLSI chip package to the mount; and
   a coupler electrically coupling a current input to the chassis.

2. An apparatus according to claim 1, further wherein the coupler is configured to electrically couple the supply current input to the chassis.

3. An apparatus according to claim 1 wherein the mount is configured to mount on the chassis via the ground current input.

4. An apparatus according to claim 1 wherein the mount is configured to mount on the chassis via the supply current input.

5. An apparatus according to claim 1, wherein the VLSI chip package is a microprocessor.

6. A bracket configured to mount a Very Large Scale Integrated (VLSI) chip package having current inputs to receive supply currents and ground currents to a computer chassis comprising:
   a mount that holds the VLSI chip package;
   a first fastener that fastens the mount to a computer chassis wherein the chassis is divided into multiple sections and wherein the mount is configured to mount on the chassis with the supply current input coupled to one section of the chassis and wherein the ground current input is coupled to another section of the chassis;
   an electrical coupling that connects a current input of the VLSI chip package to the chassis.

7. A bracket according to claim 6 wherein the electrical coupling connects the supply current input of the VLSI chip package to the chassis.

8. A bracket according to claim 6 wherein the electrical coupling connects the ground current input of the VLSI chip package to the chassis.

9. An apparatus configured to mount a Very Large Scale Integration (VLSI) chip package to a conductive chassis, the VLSI chip package having supply and ground current inputs, comprising:
   a mount that mounts the VLSI chip package to a conductive chassis wherein the chassis is divided into multiple sections and wherein the mount is configured to mount on the chassis with the supply current input coupled to one section of the chassis and wherein the ground current input is coupled to another section of the chassis;

a first fastener that couples the mount to the chassis;

a second fastener that couples the VLSI chip package to the mount; and a coupler electrically coupling a current input to the chassis.

10. An apparatus according to claim 9, further wherein the coupler is configured to electrically couple the supply current input to the chassis.

11. An apparatus according to claim 9 wherein the mount is configured to mount on the chassis via the ground current input.

12. An apparatus according to claim 11 wherein the mount is configured to mount on the chassis via the supply current input.

* * * * *